(12) United States Patent
Hsu et al.

(10) Patent No.: US 8,129,829 B2
(45) Date of Patent: Mar. 6, 2012

(54) PACKAGE SUBSTRATE HAVING EMBEDDED PHOTOSENSITIVE SEMICONDUCTOR CHIP AND FABRICATION METHOD THEREOF

(75) Inventors: Shin-Ping Hsu, Hsin-Chu (TW); Kan-Jung Chia, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 452 days.

(21) Appl. No.: 12/483,497

(22) Filed: Jun. 12, 2009

(65) Prior Publication Data
US 2009/0309179 A1 Dec. 17, 2009

(30) Foreign Application Priority Data
Jun. 13, 2008 (TW) .............................. 97122054 A

(51) Int. Cl.
*H01L 23/02* (2006.01)
(52) U.S. Cl. ........ 257/680; 257/434; 257/684; 257/693; 257/698; 438/16
(58) Field of Classification Search ............... 257/680, 257/E33.07, 434, 684, 693, 698, 780; 438/16
See application file for complete search history.

(56) References Cited

U.S. PATENT DOCUMENTS

| | | | |
|---|---|---|---|
| 7,015,579 B2 * | 3/2006 | Okada et al. ................. | 257/738 |
| 7,038,288 B2 * | 5/2006 | Lai et al. ...................... | 257/448 |
| 7,274,101 B2 * | 9/2007 | Tomita et al. ................. | 257/730 |
| 7,405,456 B2 * | 7/2008 | Chen et al. .................... | 257/434 |
| 7,423,335 B2 * | 9/2008 | Yang et al. .................... | 257/680 |
| 7,453,093 B2 * | 11/2008 | Kim et al. ....................... | 257/79 |
| 7,582,944 B2 * | 9/2009 | Fukuda et al. ................ | 257/432 |
| 7,638,813 B2 * | 12/2009 | Kinsman ........................ | 257/99 |
| 7,646,079 B2 | 1/2010 | Umemoto ...................... | 257/621 |
| 7,663,096 B2 * | 2/2010 | Farnworth et al. ............ | 250/239 |
| 7,675,131 B2 * | 3/2010 | Derderian ...................... | 257/432 |
| 2007/0272994 A1 * | 11/2007 | Huang et al. ................... | 257/434 |
| 2007/0278605 A1 * | 12/2007 | Shibayama ..................... | 257/432 |
| 2008/0142917 A1 * | 6/2008 | Lee et al. ........................ | 257/432 |
| 2009/0194865 A1 * | 8/2009 | Sekiguchi et al. ............. | 257/692 |
| 2009/0309179 A1 * | 12/2009 | Hsu et al. ....................... | 257/434 |

* cited by examiner

*Primary Examiner* — Michael Shingleton
(74) *Attorney, Agent, or Firm* — Peter F. Corless; Steven M. Jensen; Edwards Wildman Palmer LLP

(57) ABSTRACT

A packaging substrate with an embedded photosensitive semiconductor chip and a method for fabricating the same are provided. The method includes the steps of: disposing the semiconductor chip in an through cavity of a core board with the photosensitive portion of the semiconductor chip being exposed from the through cavity; forming a first circuit layer on the core board at a side opposite to the photosensitive portion so as to electrically connect the electrode pads of the semiconductor chip; and forming a light-permeable layer on the core board at the same side with the photosensitive portion via an adhesion layer so as to allow light to penetrate through the light-permeable layer and reach the photosensitive portion of the semiconductor chip. When fabricated by the method, the packaging substrate dispenses with conductive wires and a surrounding dam and thus is efficiently downsized.

14 Claims, 4 Drawing Sheets

PACKAGE SUBSTRATE HAVING EMBEDDED PHOTOSENSITIVE SEMICONDUCTOR CHIP AND FABRICATION METHOD THEREOF

BACKGROUND OF THE INVENTION

1. Field of the Invention

The present invention relates generally to packaging substrates and methods for fabricating the same, and more particularly to a packaging substrate with an embedded photosensitive semiconductor chip and a method for fabricating the same.

2. Description of Related Art

Generally, photosensitive semiconductor chip packages are integrated with external devices such as printed circuit boards before being applied to various electronic products such as digital cameras, digital video cameras, optical mice and mobile phones. To fabricate a packaging substrate with a photosensitive semiconductor chip, a semiconductor chip with an image sensor such as a CMOS or CCD sensor is first mounted to a substrate and electrically connected to the substrate by solder wires, and then a light-permeable layer is mounted to cover the photosensitive chip, thereby allowing the photosensitive chip to receive image light so as to cause the product to operate. FIGS. 1A to 1D shows a method for fabricating a conventional packaging substrate with a photosensitive semiconductor chip.

As shown in FIG. 1A, a core board 10 is provided that has undergone hole drilling, metal plating, hole filling and a circuit forming process to obtain a finished inner structure with a plurality of conductive through holes 100. The core board 10 has a first surface 10a and an opposite second surface 10b, and a plurality of conductive pads 101 is formed on the first surface 10a and the second surface 10b. As shown in FIG. 1B, a semiconductor chip 11 having an active surface 11a and a non-active surface 11b is provided. The active surface 11a has a plurality of electrode pads 110 and a photosensitive portion 111. The semiconductor chip 11 is mounted to the first surface 10a of the core board 10 via its non-active surface 11b. As shown in FIG. 1C, the electrode pads 110 of the semiconductor chip are electrically connected to the conductive pads 101 on the first surface 10a of the core board 10 through a plurality of conductive wires 12 made of gold, and a dam 13 is disposed on the core board 10 around the semiconductor chip 11 and the conductive wires 12. As shown in FIG. 1D, a light-permeable layer 14 is mounted on the dam 13 to seal the semiconductor chip 11. The dam prevents the light-permeable layer 14 from coming in contact with the semiconductor chip 11. The inner space constituted by the dam 13 and the light-permeable layer 14 keeps out contaminants to protect the semiconductor chip 11. Therein, the light-permeable layer 14 is made of glass so as to allow light to penetrate therethrough and reach the photosensitive portion 111. Further, a plurality of solder balls 15 is mounted to the conductive pads 101 on the second surface 10b of the core board 10, thereby allowing the package to be connected to a printed circuit board.

However, in the conventional package structure, the inner portion of the core board 10 needs to be processed first so as to form the conductive through holes 100, thereby complicating the fabrication process.

Further, the core board 10 must have a certain thickness for maintaining stability of the photosensitive portion 111 so as to prevent warpage of the core board 10 due to pressure exerted by the dam 13 on the edges of the core board 10, and also to provide alignment of the light-permeable layer 14 such that it is parallel with the photosensitive portion 111 so as to reduce signal distortion. As such, the resultant size of the packaging substrate cannot optimally meet the requirements for a light-weighted, compact-sized packaging substrate. Meanwhile, the dam 13 formed on the core board 10 needs to have a height of 50-200 um, and the height evenness thereof is difficult to control, which accordingly increases the difficulty of fabrication.

Furthermore, space needs to be reserved on the core board 10 for disposing of the dam 13, thereby increasing the overall planar size of the packaging substrate. In addition, the dam 13 must be higher than the highest point of the conductive wires 12, thereby increasing the overall height of the packaging substrate.

Therefore, during the fabrication process, the area and height of the conventional packaging substrate have to be increased. As a result, the packaging substrate is too large to be integrated into minimized electronic products.

Accordingly, overcoming the above-described drawbacks is a critical concern.

SUMMARY OF THE INVENTION

According to the above drawbacks, an objective of the present invention is to provide a packaging substrate with an embedded photosensitive semiconductor chip and a method for fabricating the same that avoids warpage of the packaging substrate.

Another objective of the present invention is to provide a packaging substrate with an embedded photosensitive semiconductor chip and a method for fabricating the same that provides a compact-sized packaging substrate.

A further objective of the present invention is to provide a packaging substrate with an embedded photosensitive semiconductor chip and a method for fabricating the same that utilizes a simplified fabrication process.

In order to achieve the above and other objectives, the present invention provides a method for fabricating a packaging substrate with an embedded photosensitive semiconductor chip, which comprises: providing a core board having a first surface and an opposite second surface, the core board having an through cavity penetrating the first surface and the second surface; providing a semiconductor chip having a first surface and an opposite second surface and fixing the semiconductor chip in the through cavity of the core board, with the first surface of the semiconductor chip being at the same side with the first surface of the core board, wherein the first surface of the semiconductor chip has a photosensitive portion and a plurality of first electrode pads, and the second surface of the semiconductor chip has a plurality of second electrode pads, and wherein the semiconductor chip further comprises a plurality of conductive through holes for electrically connecting the first and second electrode pads; forming a first dielectric layer on the second surface of the core board and the second surface of the semiconductor chip, and forming a plurality of vias in the first dielectric layer to expose the second electrode pads; forming a first circuit layer on the first dielectric layer and forming a plurality of first conductive vias in the vias of the first dielectric layer for electrically connecting the first circuit layer and the second electrode pads; forming an adhesion layer on the first surface of the core board and the first surface of the semiconductor chip, the adhesion layer having a light-permeable window for exposing the photosensitive portion of the semiconductor chip; and forming a light-permeable layer on the adhesion layer, the light-permeable layer covering the light-permeable window of the adhesion layer.

In the above-described method, an adhesive can fill the gap between the core board and the semiconductor chip so as to fix the semiconductor chip in the through cavity. Further, the light-permeable layer can be made of glass; however, the material is not limited thereto as other light-permeable materials can be employed.

The method for fabricating the first circuit layer and the first conductive vias comprises: forming a conductive seed-layer on the first dielectric layer and on the walls of the vias in the first dielectric layer; forming a resist layer on the conductive seed-layer and forming a plurality of open areas in the resist layer to expose the conductive seed-layer on the walls of the vias and portions of the conductive seed-layer on the dielectric layer; forming the first circuit layer on the first dielectric layer in the open areas of the resist layer, and forming the first conductive vias in the vias; and removing the resist layer and the conductive seed-layer covered by the resist layer.

The above-described method can further comprise forming a solder mask layer on the first dielectric layer and the first circuit layer, and forming a plurality of openings in the solder mask layer for exposing portions of the first circuit layer as conductive pads. Alternatively, the above-described method can comprise forming a built-up structure on the first dielectric layer and the first circuit layer, and forming a solder mask layer on the built-up structure, wherein the built-up structure comprises at least a second dielectric layer, a second circuit layer formed on the second dielectric layer, and a plurality of second conductive vias electrically connecting the first and second circuit layers, and wherein a plurality of openings is formed in the solder mask layer for exposing portions of the outermost second circuit layer as conductive pads. In addition, solder balls can be formed on the conductive pads.

The present invention further provides a packaging substrate with an embedded photosensitive semiconductor chip, which comprises: a core board having a first surface, an opposite second surface and an through cavity penetrating the first surface and the second surface thereof; a semiconductor chip having a first surface and an opposite second surface, wherein the first surface of the semiconductor chip has a photosensitive portion and a plurality of first electrode pads, and the second surface of the semiconductor chip has a plurality of second electrode pads, and wherein the semiconductor chip further comprises a plurality of conductive through holes for electrically connecting the first and second electrode pads, and the semiconductor chip is disposed in the through cavity of the core board, with the first surface of the semiconductor chip being at the same side with the first surface of the core board; an adhesion layer disposed on the first surface of the core board and the first surface of the semiconductor chip and having a light-permeable window for exposing the photosensitive portion of the semiconductor chip; a light-permeable layer disposed on the adhesion layer and covering the light-permeable window of the adhesion layer; a first dielectric layer disposed on the second surface of the core board and the second surface of the semiconductor chip; and a first circuit layer disposed on the first dielectric layer and having a plurality of first conductive vias disposed in the first dielectric layer for electrically connecting to the second electrode pads.

In the above-described structure, an adhesive can fill the gap between the core board and the semiconductor chip so as to fix the semiconductor chip in the through cavity of the core board. In addition, the light-permeable layer can be made of glass; however, it is not limited thereto as other light-permeable materials can be employed.

The packaging substrate can further comprise a solder mask layer disposed on the first dielectric layer and the first circuit layer and having a plurality of openings for exposing portions of the first circuit layer as conductive pads. Alternatively, the packaging substrate can further comprise a built-up structure disposed on the first dielectric layer and the first circuit layer, and a solder mask layer disposed on the built-up structure, wherein the built-up structure comprises at least a second dielectric layer, a second circuit layer disposed on the second dielectric layer, and a plurality of second conductive vias electrically connecting the first and second circuit layers, and the solder mask layer has a plurality of openings formed therein for exposing portions of the outermost second circuit layer as conductive pads. In addition, solder balls can be disposed on the conductive pads.

Therefore, the present invention eliminates the need of forming conductive through holes in the core board by embedding the semiconductor chip in the core board, thus simplifying the fabrication process. Also, the semiconductor chip is electrically connected to the core board through the first and second electrode pads and the conductive through holes of the semiconductor chip and the first circuit layer. Also, the light-permeable layer is disposed on the core board through the adhesion layer. Accordingly, compared with the prior art that requires conductive wires and a surrounding dam, the present invention not only reduces the height of the structure, but also greatly reduces the area of the structure, thereby achieving a compact-sized packaging substrate. Further, since no pressure is applied to the edges of the core board, warpage of the packaging substrate can be avoided.

BRIEF DESCRIPTION OF DRAWINGS

FIGS. 2I' and 2J' are cross-sectional views showing another embodiment of FIGS. 2I and 2J.

DETAILED DESCRIPTION OF PREFERRED EMBODIMENTS

The following illustrative embodiments are provided to illustrate the disclosure of the present invention; these and other advantages and effects will be apparent to those skilled in the art after reading the disclosure of this specification.

FIGS. 2A to 2J are cross-sectional views showing a packaging substrate with an embedded semiconductor chip and a method for fabricating the same according to the present invention.

Figure 1A:
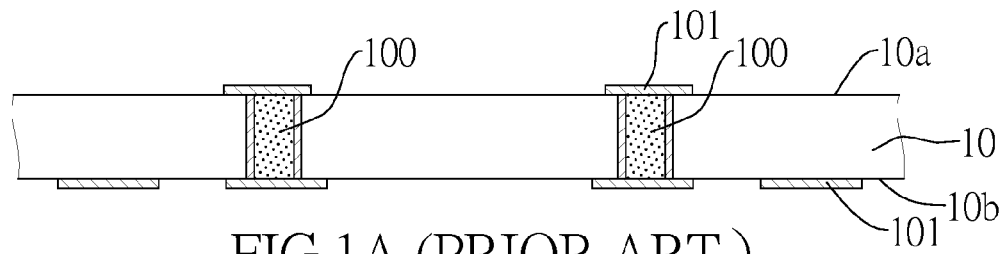
FIGS. 1A to 1D are cross-sectional views showing a method for fabricating a conventional package structure with a photosensitive semiconductor chip.
Figure 1B:
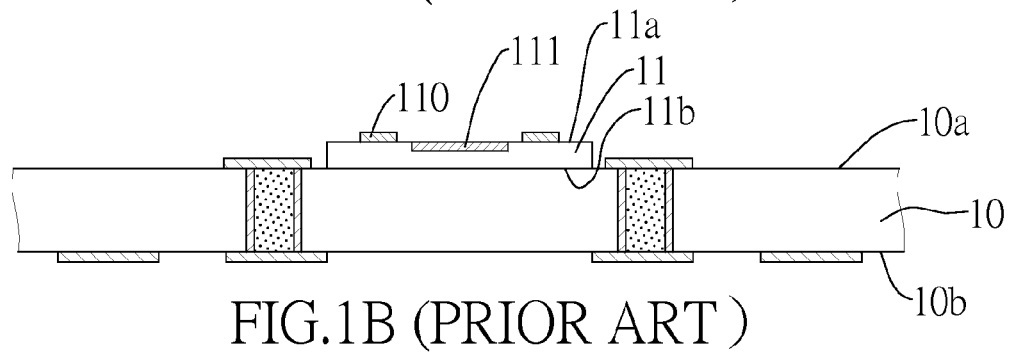
Figure 1C:
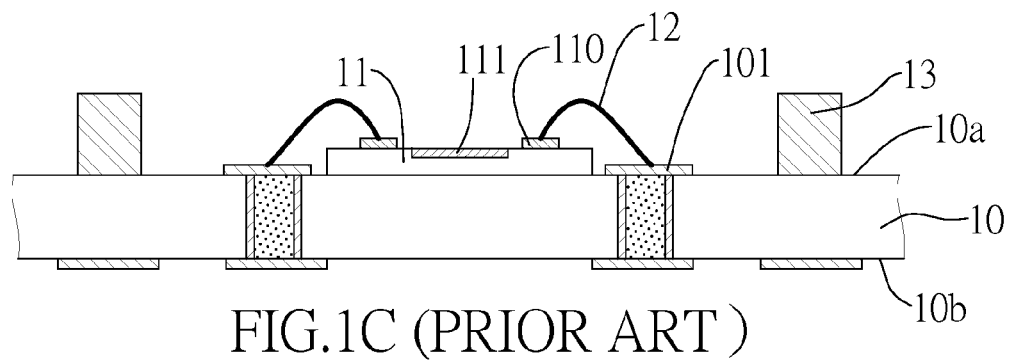
Figure 1D:
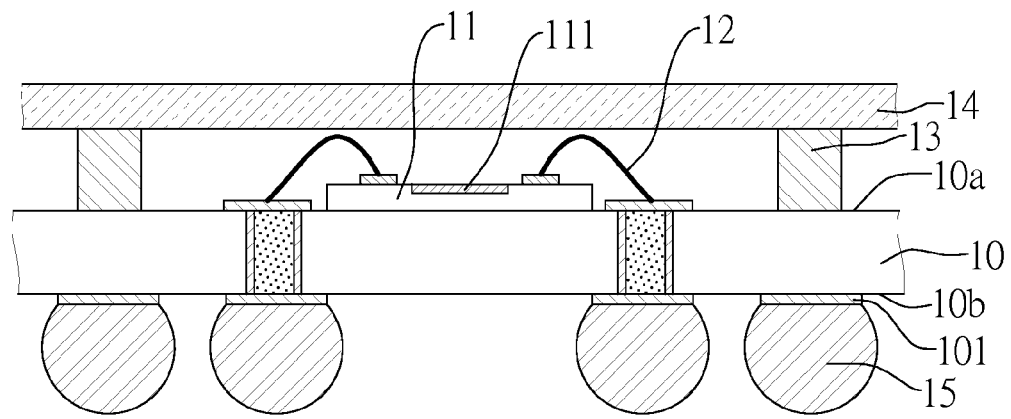
Figure 2A:
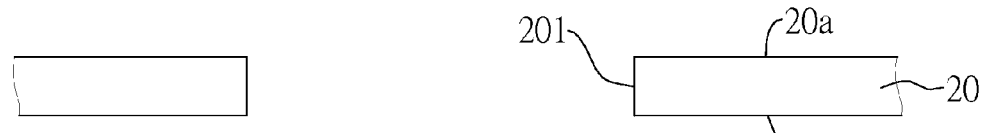
FIGS. 2A to 2J are cross-sectional views showing a method for fabricating a packaging substrate with an embedded photosensitive semiconductor chip according to the present invention.

As shown in FIG. 2A, a core board 20 having a first surface 20a and an opposite second surface 20b is provided, wherein an through cavity 201 is formed in the core board 20 penetrating the first surface 20a and the second surface 20b. The core board 20 is an insulating board or a packaging substrate with a finished circuit layout. Since fabrication techniques related to this packaging substrate are well known in the art and are not characteristics of the present invention, detailed description thereof is omitted.

Figure 2B:
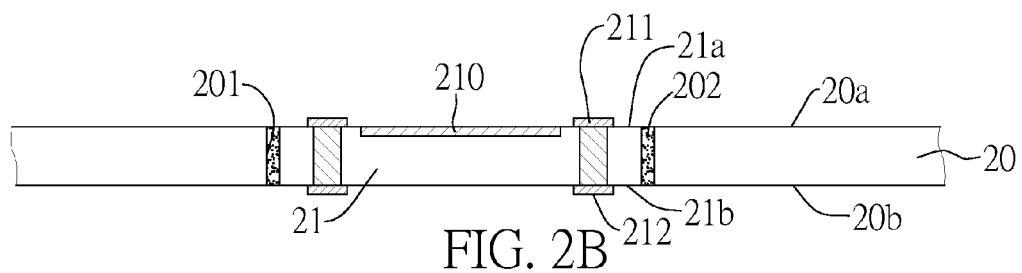

As shown in FIG. 2B, a semiconductor chip 21 having a first surface 21a and an opposite second surface 21b is disposed in the through cavity 201 of the core board 20, and an adhesive 202 fills the gap between the semiconductor chip 21 and the core board 20 so as to fix the semiconductor chip 21 in the through cavity 201, wherein the first surface 21a of the semiconductor chip 21 is at the same side with the first surface 20a of the core board 20. It should be noted that various methods can be used for fixing the semiconductor chip 21 in the core board 20, and since they are well known in the art and are not characteristics of the present invention, detailed description thereof is omitted herein.

The first surface 21a of the semiconductor chip 21 has a photosensitive portion 210 and a plurality of first electrode pads 211, and the second surface 21b has a plurality of second electrode pads 212. The semiconductor chip 21 further comprises a plurality of conductive through holes 213 formed therein for electrically connecting the first and second electrode pads 211, 212.

Figure 2C:
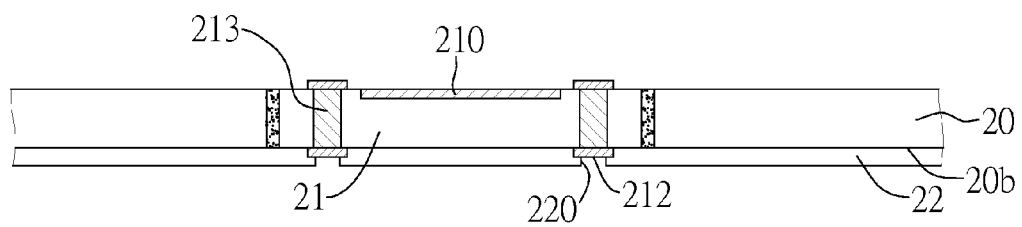

As shown in FIG. 2C, a first dielectric layer 22 is formed on the second surface 20b of the core board 20 and the second surface 21b of the semiconductor chip 21, and a plurality of vias 220 is formed in the first dielectric layer 22 to expose a portion of the surfaces of the second electrode pads 212.

Figure 2D:
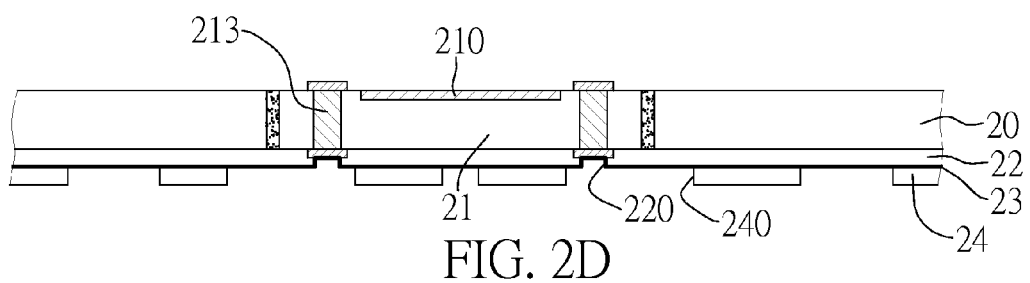

As shown in FIG. 2D, a conductive seed-layer 23 is formed on the first dielectric layer 22 and in the vias 220 of the first dielectric layer 22. Further, a resist layer 24 is formed on the conductive seed-layer 23, and a plurality of open areas 240 are formed in the resist layer 24 to expose the conductive seed-layer 23 on the walls of the vias 220 in the first dielectric layer 22 and portions of the conductive seed-layer 23 on the first dielectric layer 22.

The conductive seed-layer 23 functions as a current conductive path in a subsequent electroplating process, wherein the conductive seed-layer 23 can be made of a pure metal, an alloy, or several deposited metal layers. The resist layer 24 can be, for example, a dry film or liquid photoresist, wherein the resist layer 24 may be formed on the conductive seed-layer 23 by printing, spin coating or attaching and patterned by exposure and development so as to form the openings 240.

Figure 2E:
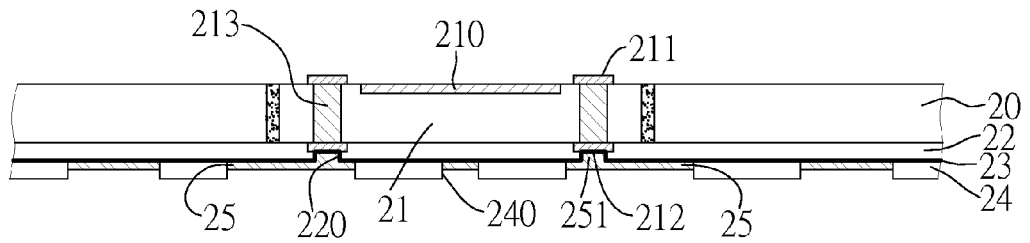

As shown in FIG. 2E, by using the conductive seed-layer 23 as a current conductive path, an electroplating process is performed so as to form a first circuit layer 25 on the first dielectric layer 22 in the openings 240 of the resist layer 24 and form first conductive vias 251 in the vias 220 of the first dielectric layer 22 for electrically connecting the first circuit layer 25 and the second electrode pads 212. Preferably, the first circuit layer 25 can be made of copper, which is a conventional electroplating material and has low cost. However, the first circuit layer 25 is not limited thereto.

Figure 2F:
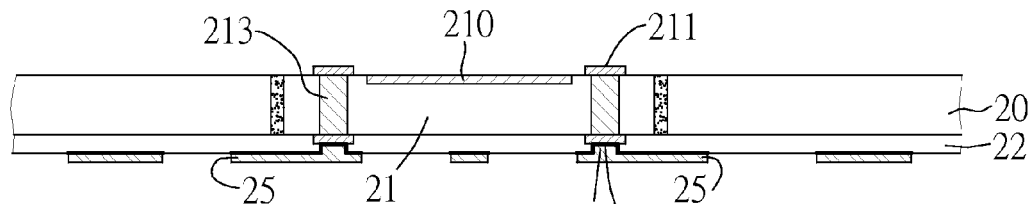
Figure 2G:
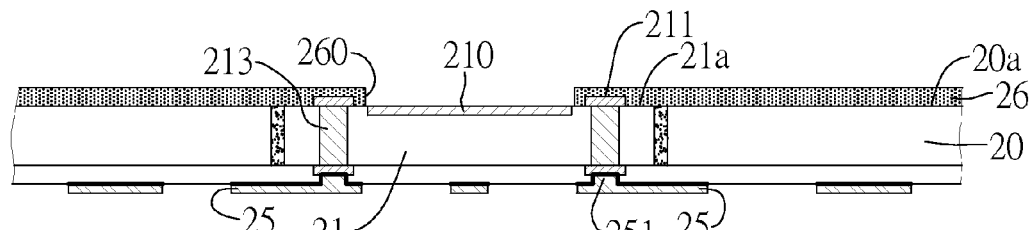

As shown in FIGS. 2F and 2G, the resist layer 24 and the conductive seed-layer 23 covered by the resist layer 24 are removed. Subsequently, an adhesion layer 26 is formed on the first surface 20a of the core board 20 and the first surface 21a of the semiconductor chip 21. The adhesion layer 26 has an light-permeable window 260 for exposing the photosensitive portion 210 of the semiconductor chip 21.

Figure 2H:
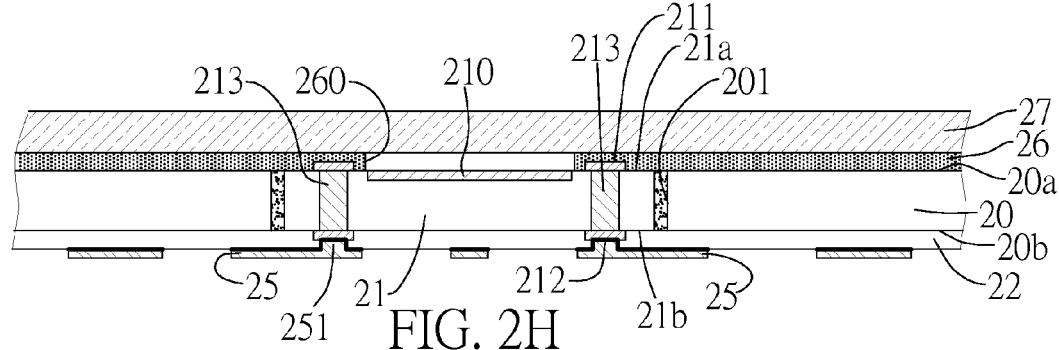

As shown in FIG. 2H, a light-permeable layer 27 is formed on the adhesion layer 26, covering the light-permeable window 260. In the present embodiment, the light-permeable layer 27 is made of glass, which allows light to penetrate through the light-permeable layer 27 so as to reach the photosensitive portion 210.

Figure 2I:
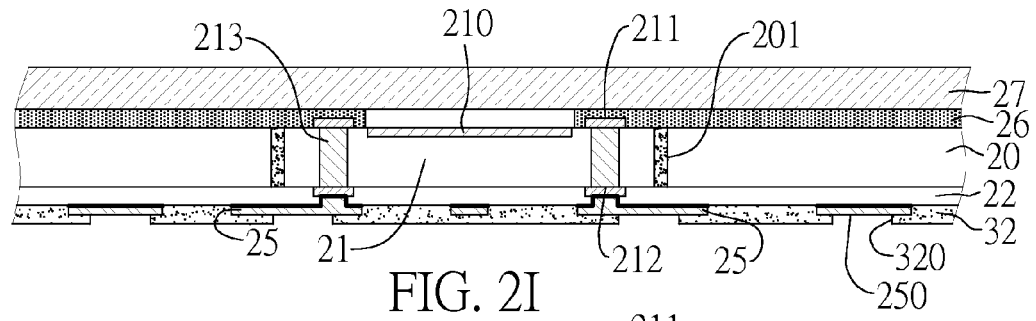
Figure 2J:
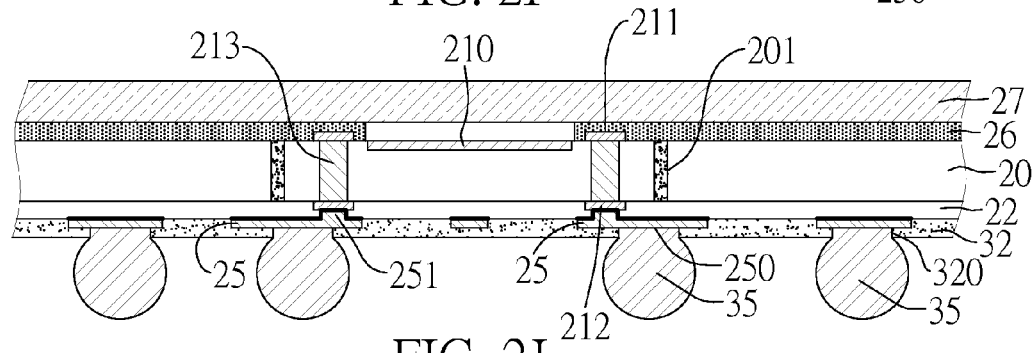
Figure 2I:
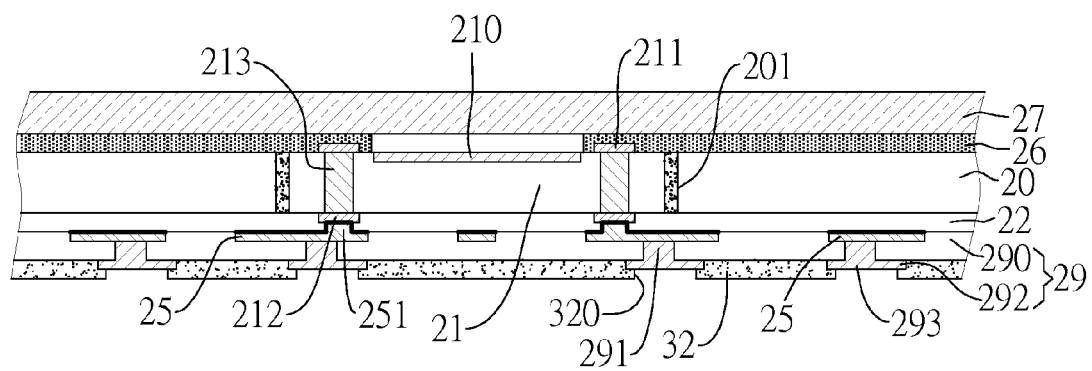
Figure 2J:
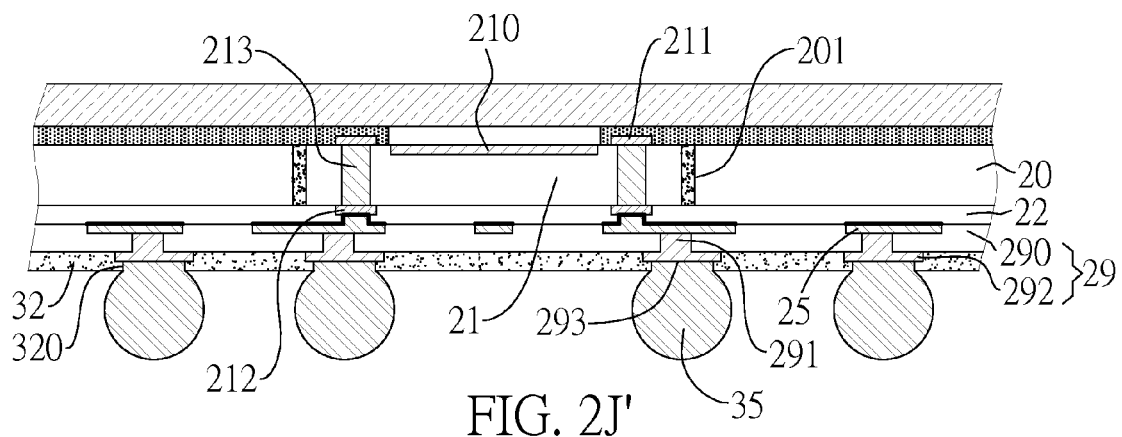

As shown in FIGS. 2I and 2J, a solder mask layer 32 is formed on the first dielectric layer 22 and the first circuit layer 25, and a plurality of openings 320 is formed in the solder mask layer 32 to expose a portion of the first circuit layer 25 as conductive pads 250. Further, solder balls 35 are formed on the conductive pads 250 for electrically connecting with an external electronic device.

Alternatively, as shown in FIGS. 2I' and 2J', after the process of FIG. 2H, a built-up structure 29 is formed on the first dielectric layer 22 and the first circuit layer 25. Since the method of fabricating the built-up structure 29 is well known in the art and is not characteristics of the present invention, detailed description thereof is omitted herein.

The built-up structure 29 comprises at least a second dielectric layer 290, a second circuit layer 292 formed on the second dielectric layer 290, and a plurality of conductive vias 291 electrically connecting the second circuit layer 292 and the first circuit layer 25. Further, a solder mask layer 32 is formed on the built-up structure 29, and a plurality of openings 320 is formed in the solder mask layer 32 to expose a portion of the second circuit layer 292 as conductive pads 293. Finally, solder balls 35 are formed on the conductive pads 293 for electrically connecting with an external electronic device.

Compared with the prior art, the present invention embeds the semiconductor chip 21 with the conductive through holes 213 in the core board 20 so as to eliminate the need of forming other conductive structures in the core board 20.

Further, by embedding the semiconductor chip 21 in the core board 20 and electrically connecting the semiconductor chip 21 with the core board 20 through the first and second electrode pads 211, 212, the conductive through holes 213 and the first circuit layer 25, instead of by using conductive wires, the height of the packaging substrate is significantly reduced.

In addition, the present invention eliminates the need of a dam as is required in the prior art by forming the adhesion layer 26 on the first surface 20a of the core board 20 and the first surface 21a of the semiconductor chip 21 for disposing of the light-permeable layer 27, thereby reducing the height of the packaging substrate and reducing the whole planar area of the packaging substrate, and further avoiding pressure exerted by the dam on the edges of the core board 20.

The present invention further provides a packaging substrate with an embedded photosensitive semiconductor chip, comprising: a core board 20 having a first surface 20a, an opposite second surface 20b, and an through cavity 201 penetrating the first surface 20a and the second surface 20b; a semiconductor chip 21 having a first surface 21a and an opposite second surface 21b, wherein the first surface 21a has a photosensitive portion 210 and a plurality of first electrode pads 211, and the second surface 21b has a plurality of second electrode pads 212, and wherein the semiconductor chip 21 further comprises a plurality of conductive through holes 213 for electrically connecting the first and second electrode pads 211, 212, and wherein the semiconductor chip 21 is disposed in the through cavity 201 of the core board 20, with the first surface 21a of the semiconductor chip 21 being at the same side with the first surface 20a of the core board 20; an adhesion layer 26 disposed on the first surface 20a of the core board 20 and the first surface 21a of the semiconductor chip 21, wherein the adhesion layer 26 has a light-permeable window 260 for exposing the photosensitive portion 210 of the semiconductor chip 21; a light-permeable layer 27 disposed on the adhesion layer 26 and covering the light-permeable window 260 of the adhesion layer 26; a first dielectric layer 22 disposed on the second surface 20b of the core board 20 and the second surface 21b of the semiconductor chip 21; and a first circuit layer 25 disposed on the first dielectric layer 22 and having a plurality of first conductive vias 251 disposed in the first dielectric layer 22 for electrically connecting the second electrode pads 212.

In addition, the packaging substrate has a solder mask layer 32 formed on the first dielectric layer 22 and the first circuit layer 25. The solder mask layer 32 has a plurality of openings 320 for exposing the conductive pads 250 such that solder balls 35 can be formed thereon for electrically connecting with an external electronic device.

Alternatively, the packaging substrate has a built-up structure 29 disposed on the first dielectric layer 22 and the first circuit layer 25. The built-up structure 29 comprises at least a second dielectric layer 290, a second circuit layer 292 formed on the second dielectric layer 290, and a plurality of second conductive vias electrically connecting the second circuit layer 292 and the first circuit layer 25. A solder mask layer 32 is further formed on the built-up structure 29 and has a plurality of openings 320 to expose the conductive pads 293 such that solder balls 35 can be disposed thereon for electrically connecting with an external electronic device.

Therefore, the present invention simplifies the fabrication process by embedding in the core board the semiconductor chip having conductive through holes and reduces the size of the packaging substrate by eliminating the need of conductive wires and a surrounding dam, thereby enabling the packaging substrate to meet the size demands of minimized electronic products. Further, since no pressure is applied to the edges of the core board, warpage of the packaging substrate can be avoided.

The above-described descriptions of the detailed embodiments are provided to illustrate the preferred implementation according to the present invention, and are not intended to limit the scope of the present invention. Accordingly, various modifications and variations completed by those with ordinary skill in the art will fall within the scope of the present invention as defined by the appended claims.

What is claimed is:

1. A packaging substrate with an embedded photosensitive semiconductor chip, comprising:
    a core board having a first surface, an opposite second surface, and a through cavity penetrating the first surface and the second surface;
    a semiconductor chip having a first surface and an opposite second surface, wherein the first surface has a photosensitive portion and a plurality of first electrode pads, the second surface has a plurality of second electrode pads, and wherein the semiconductor chip further comprises a plurality of conductive through holes for electrically connecting the first and second electrode pads, and wherein the semiconductor chip is disposed in the through cavity of the core board, with the first surface of the semiconductor chip being at a same side with the first surface of the core board;
    an adhesion layer disposed on the first surface of the core board and the first surface of the semiconductor chip, the adhesion layer having a light-permeable window for exposing the photosensitive portion of the semiconductor chip;
    a light-permeable layer disposed on the adhesion layer and covering the light-permeable window of the adhesion layer;
    a first dielectric layer disposed on the second surface of the core board and the second surface of the semiconductor chip; and
    a first circuit layer disposed on the first dielectric layer and having a plurality of first conductive vias disposed in the first dielectric layer for electrically connecting with the second electrode pads.

2. The packaging substrate of claim 1, wherein an adhesive fills the gap between the core board and the semiconductor chip.

3. The packaging substrate of claim 1, wherein the light-permeable layer is made of glass.

4. The packaging substrate of claim 1, further comprising a built-up structure disposed on the first dielectric layer and the first circuit layer, and a solder mask layer disposed on the built-up structure, wherein the built-up structure comprises at least a second dielectric layer, a second circuit layer disposed on the second dielectric layer, and a plurality of second conductive vias electrically connecting the first and second circuit layers, and wherein the solder mask layer has a plurality of openings formed therein for exposing portions of the outermost second circuit layer as conductive pads.

5. The packaging substrate of claim 1, further comprising a solder mask layer disposed on the first dielectric layer and the first circuit layer and having a plurality of openings for exposing portions of the first circuit layer as conductive pads.

6. The packaging substrate of claim 4 or 5, wherein solder balls are disposed on the conductive pads.

7. A method for fabricating a packaging substrate with an embedded photosensitive semiconductor chip, comprising:
    providing a core board having a first surface and an opposite second surface, wherein the core board has an through cavity penetrating the first surface and the second surface thereof;
    providing a semiconductor chip having a first surface and an opposite second surface and fixing the semiconductor chip in the through cavity of the core board, with the first surface of the semiconductor chip being at a same side with the first surface of the core board, wherein the first surface of the semiconductor chip has a photosensitive portion and a plurality of first electrode pads, and the second surface of the semiconductor chip has a plurality of second electrode pads, and wherein the semiconductor chip further comprises a plurality of conductive through holes for electrically connecting the first and second electrode pads;
    forming a first dielectric layer on the second surface of the core board and the second surface of the semiconductor chip, and forming a plurality of vias in the first dielectric layer to expose the second electrode pads;
    forming a first circuit layer on the first dielectric layer and forming a plurality of first conductive vias in the vias of the first dielectric layer for electrically connecting the first circuit layer and the second electrode pads;
    forming an adhesion layer on the first surface of the core board and the first surface of the semiconductor chip, the adhesion layer having a light-permeable window for exposing the photosensitive portion of the semiconductor chip; and
    forming a light-permeable layer on the adhesion layer, the light-permeable layer covering the light-permeable window of the adhesion layer.

8. The method of claim 7, wherein an adhesive fills the gap between the core board and the semiconductor chip so as to fix the semiconductor chip in the through cavity.

9. The method of claim 7, wherein the light-permeable layer is made of glass.

10. The method of claim 7, wherein the method for fabricating the first circuit layer and the first conductive vias comprises:
    forming a conductive seed-layer on the first dielectric layer and on the walls of the vias in the first dielectric layer;
    forming a resist layer on the conductive seed-layer and forming a plurality of open areas in the resist layer to expose the conductive seed-layer on the walls of the vias and portions of the conductive seed-layer on the dielectric layer;
    forming the first circuit layer on the first dielectric layer in the open areas of the resist layer, and forming the first conductive vias in the vias by electroplating; and
    removing the resist layer and the conductive seed-layer covered by the resist layer.

11. The method of claim 10, further comprising forming a built-up structure on the first dielectric layer and the first circuit layer and forming a solder mask layer on the built-up structure, wherein the built-up structure comprises at least a second dielectric layer, a second circuit layer formed on the second dielectric layer, and a plurality of second conductive vias electrically connecting the first and second circuit layers, and wherein a plurality of openings is formed in the solder mask layer for exposing portions of the outermost second circuit layer as conductive pads.

12. The method of claim 11, further comprising forming solder balls on the conductive pads.

13. The method of claim 10, further comprising forming a solder mask layer on the first dielectric layer and the first circuit layer and forming a plurality of openings in the solder mask layer for exposing portions of the first circuit layer as conductive pads.

14. The method of claim 13, further comprising forming solder balls on the conductive pads.

\* \* \* \* \*